(12) United States Patent
Hasan et al.

(10) Patent No.: US 10,522,703 B2
(45) Date of Patent: *Dec. 31, 2019

(54) EFFICIENCY ENHANCEMENT OF SOLAR CELLS USING LIGHT MANAGEMENT

(71) Applicant: THE UNIVERSITY OF NORTH CAROLINA AT CHARLOTTE, Charlotte, NC (US)

(72) Inventors: Mohamad-Ali Hasan, Charlotte, NC (US); Michael A. Fiddy, Huntersville, NC (US); Terence A. Goveas, Charlotte, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 132 days.

This patent is subject to a terminal disclaimer.

(21) Appl. No.: 15/868,601

(22) Filed: Jan. 11, 2018

(65) Prior Publication Data

US 2018/0138341 A1    May 17, 2018

Related U.S. Application Data

(63) Continuation of application No. 14/823,299, filed on Aug. 11, 2015, now Pat. No. 9,871,158, which is a
(Continued)

(51) Int. Cl.
*H01L 31/0216* (2014.01)
*H01L 31/0232* (2014.01)
(Continued)

(52) U.S. Cl.
CPC ........ *H01L 31/055* (2013.01); *H01L 31/0236* (2013.01); *H01L 31/02168* (2013.01);
(Continued)

(58) Field of Classification Search
None
See application file for complete search history.

(56) References Cited

U.S. PATENT DOCUMENTS

| 5,024,953 A | 6/1991 | Uematsu et al. | |
|---|---|---|---|
| 5,110,499 A * | 5/1992 | Reilly | C09K 11/584 |
| | | | 252/301.6 S |

(Continued)

FOREIGN PATENT DOCUMENTS

| DE | 4033658 A1 | 4/1992 |
|---|---|---|
| DE | 19954954 A1 | 5/2001 |

(Continued)

OTHER PUBLICATIONS

Strümpel et al. "Erbium-doped up-converters of silicon solar cells: Assessment of the potential." Proceedings of the 20th European Photovoltaic Solar Energy Conference. 43-46. Published 2005 (Year: 2005).*

(Continued)

*Primary Examiner* — Magali P Slawski
(74) *Attorney, Agent, or Firm* — Tillman Wright, PLLC; James D. Wright; David R. Higgins

(57) ABSTRACT

A photovoltaic cell includes a junction, formed from an n-type semiconductor material and a p-type semiconductor material, a trench, opening toward the light-incident side of the junction, for trapping reflected light, and two photon conversion layers. A first photon conversion layer, arranged at the light-incident side of the junction, converts photons from a higher energy to a lower energy suitable for absorption by the semiconductor material, and a second photon conversion layer, arranged at the opposite side of the junction, converts photons from a lower energy to a higher energy suitable for absorption by the semiconductor material.

44 Claims, 16 Drawing Sheets

Related U.S. Application Data continuation of application No. 13/255,487, filed as application No. PCT/US2010/026722 on Mar. 9, 2010, now abandoned.

(60) Provisional application No. 61/158,529, filed on Mar. 9, 2009.

(51) Int. Cl.
  *H01L 31/0236* (2006.01)
  *G02B 1/118* (2015.01)
  *G02B 5/00* (2006.01)
  *H01L 31/055* (2014.01)
  *H01L 31/0352* (2006.01)
  *H01L 31/054* (2014.01)

(52) U.S. Cl.
  CPC .. *H01L 31/02322* (2013.01); *H01L 31/03529* (2013.01); *H01L 31/0547* (2014.12); *Y02E 10/52* (2013.01)

(56) References Cited

U.S. PATENT DOCUMENTS

| | | | |
|---|---|---|---|
| 5,248,621 A * | 9/1993 | Sano | H01L 31/1804 117/101 |
| 5,759,292 A | 6/1998 | Arimoto et al. | |
| 6,995,371 B2 | 2/2006 | Garber et al. | |
| 7,193,210 B2 | 3/2007 | Garber et al. | |
| 7,217,882 B2 | 5/2007 | Walukiewicz et al. | |
| 7,391,024 B2 | 6/2008 | Garber et al. | |
| 7,655,860 B2 | 2/2010 | Parsons | |
| 9,871,158 B2 | 1/2018 | Hasan et al. | |
| 2001/0011553 A1* | 8/2001 | Katsu | H01L 31/022425 136/256 |
| 2004/0105646 A1* | 6/2004 | Fukuda | G02B 1/11 385/129 |
| 2007/0159698 A1* | 7/2007 | Taguchi | G02B 1/118 359/586 |
| 2007/0240754 A1 | 10/2007 | Gayout et al. | |
| 2009/0095341 A1 | 4/2009 | Pfenninger et al. | |
| 2009/0173957 A1* | 7/2009 | Brunner | C09K 11/7701 257/98 |
| 2009/0255577 A1 | 10/2009 | Tischler | |
| 2009/0295257 A1 | 12/2009 | Wang et al. | |
| 2010/0012177 A1 | 1/2010 | Yang et al. | |
| 2010/0071760 A1 | 3/2010 | Kwok et al. | |
| 2010/0300510 A1* | 12/2010 | Goldman | H01L 31/0547 136/246 |
| 2011/0315219 A1 | 12/2011 | Hasan et al. | |
| 2016/0043258 A1 | 2/2016 | Hasan et al. | |

FOREIGN PATENT DOCUMENTS

| | | | | |
|---|---|---|---|---|
| EP | 2067839 A1 | 6/2009 | | |
| GB | 2023633 A | 1/1980 | | |
| GB | 1562994 A * | 3/1980 | | H01L 31/055 |
| GB | 1562994 A | 3/1980 | | |
| WO | 03079457 A1 | 9/2003 | | |
| WO | WO-03079457 A1 * | 9/2003 | | H01L 31/055 |
| WO | 2010104890 A2 | 9/2010 | | |
| WO | 2010104890 A3 | 11/2010 | | |

OTHER PUBLICATIONS

Information Disclosure Statement (IDS) Letter Regarding Common Patent Application(s), dated Apr. 11, 2018.

"International Search Report" and "Written Opinion of the International Search Authority" (ISA/European Patent Office), in International Patent Application Serial No. PCT/US2010/026722, dated Sep. 10, 2010 (16 pages).

Preuss, P. "A Step Closer to the Optimum Solar Cell." Science Beat, Berkeley Lab, Mar. 24, 2004, available at <http://www.lbl.gov/Science-Articles/Archive/sb-MSD-multibandsolar-panels.html>, accessed on Feb. 17, 2010 (4 pages).

Trupke, T.; Shalav, A.; Richards, B.S.; Wurfel, P.; and Green, M.A. "Efficiency enhancement of solar cells by luminescent up-conversion of sunlight." Solar Energy Materials & Solar Cells, 90:3327-3338 (2006), Aug. 2, 2006 (12 pages).

Richards, B.S. "Luminescent layers for enhanced silicon solar cell performance: Down-conversion." Solar Energy Materials & Solar Cells, 90:1189-1207 (2006), Aug. 29, 2005 (19 pages).

Tsakalakos, L. "Nanostructures for photovoltaics." Materials Science and Engineering R, 62:175-189 (2008), Aug. 15, 2008 (15 pages).

* cited by examiner

EFFICIENCY ENHANCEMENT OF SOLAR CELLS USING LIGHT MANAGEMENT

CROSS-REFERENCE TO RELATED APPLICATIONS

The present application is a U.S. continuation patent application of, and claims priority under 35 U.S.C. § 120 to, U.S. nonprovisional patent application Ser. No. 14/823,299, filed Aug. 11, 2015, which '299 application published as U.S. Patent Application Publication No. US 2016/0043258 A1 on Feb. 11, 2016 and issued as U.S. Pat. No. 9,871,158 on Jan. 16, 2018, which '299 application, the application publication thereof, and the patent issuing therefrom are each expressly incorporated herein by reference in their entirety, and which '299 application is a U.S. continuation patent application of, and claims priority under 35 U.S.C. § 120 to, U.S. nonprovisional patent application Ser. No. 13/255,487, filed Sep. 8, 2011, which '487 application published as U.S. Patent Application Publication No. US 2011/0315219 A1 on Dec. 29, 2011, which '487 application and the application publication thereof are each expressly incorporated herein by reference in their entirety, and which '487 application is a U.S. national stage application under 35 U.S.C. § 371 of International Application No. PCT/US2010/026722, filed Mar. 9, 2010 and designating the U.S., which international application published as International Application Publication No. WO 2010/104890 A2 on Sep. 16, 2010, which international application and the application publication thereof are each expressly incorporated herein by reference in their entirety, and which international application claims the benefit of U.S. provisional patent application Ser. No. 61/158,529, filed Mar. 9, 2009, which '529 application is expressly incorporated herein by reference in its entirety.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

Field of the Present Invention

The present invention relates generally to photovoltaic cells, and, in particular, to photovoltaic cells having improved surface geometries coated with layers doped with phosphors for both down-conversion and up-conversion.

Background

Photovoltaic solar cells are a well-known technology. The solar market is growing at a rapid speed; annual shipments of solar cell modules have been increasing at a rate of over 30% in the past few years.

As shown in FIG. 1, a conventional solar cell 10 includes an n-type semiconductor material 14 and a p-type semiconductor material 16. The n-type semiconductor material 14 is doped with impurity atoms to form an electrically negative material that already has a few electrons in its conduction band. The p-type semiconductor material 16 is doped to leave missing electrons, or holes, in its valence band. The junction 12 between the n- and p-type semiconductor materials 14,16 creates a voltage bias. When the solar cell absorbs incoming photons, electrons are caused to migrate toward the positive side of the junction 12 and holes toward the negative side, forming an electric current.

Unfortunately, the efficiency of conventional solar cells—that is, the proportion of the sunlight falling on the solar cell that is converted to electricity—is very low. Sunlight comes in many colors, combining low-energy infrared photons with high-energy ultraviolet photons and all the visible-light photons in between. The visible region of the solar spectrum, whose photons have wavelengths of between 400 nm and 700 nm and energies of between 3.1 eV and 1.77 eV, contains only about 43% of the irradiance. The ultraviolet region of the solar spectrum, whose photons have wavelengths less than 400 nm and energies of greater than 3.1 eV, contains about 5% of the total irradiance, while the infrared region, whose photons have wavelengths of greater than 700 nm and energies of less than 1.7 eV, contains about 52% of the irradiance. This is demonstrated in FIG. 2, which is a graphical representation of the relative photon energies present in sunlight under standardized conditions. In particular, solar radiation flux, measured in photons per second per meter squared, is plotted against photon energies for sunlight incident on the earth's surface under the well-established AM1.5 standard. Flux is utilized in FIG. 2 instead of irradiance (W/m$^2$×nm) because flux is the only one-to-one relevant value when it comes to generation of carriers within the cell.

Each photovoltaic material responds to a narrow range of these energies, corresponding to its characteristic band gap, which is the amount of energy, expressed in electron volts (eV), that are required to kick an electron from a semiconductor's valence band (where electrons, bound to atoms, are plentiful) into its empty conduction band. Photons with energy lower than the band gap escape unabsorbed, while photons with higher energy are absorbed, but most of their energy is wasted as heat. Because band gaps are so limited, typical solar cells have efficiencies of no more than 25%, meaning most of the sunlight falling on them is not converted to electricity.

One common photovoltaic material is silicon (Si). FIG. 3 is a graphical representation illustrating the dependence of silicon absorption depth on light energy. As demonstrated in FIG. 3, Si is almost transparent to photons with energies lower than its bandgap. These photons do not contribute to the generation of electron-hole pairs. At an intermediate energy range of 3 eV>E>1.5 eV, Si absorbs light to a depth ranging from about 0.1 to 10 microns. In this range, Si has its maximum efficiency for solar cell applications. Electron-hole pairs are generated within the junction volume (for most cells) and are driven to the contacts by the built-in field. At energies higher than about 3 eV, the light is absorbed in the sub-surface area, 100 nm from the surface. Since carriers are generated near the surface and there is no built-in field to drive the carriers to the surface, a large proportion of these carriers recombine at surface states or within the subsurface layer, thereby resulting in minimal contribution to the generated current and much of the absorbed energy being converted to heat. In summary, Si utilizes about 45% of the incident light, assuming that the light is absorbed, minimal amount is reflected, and carriers are collected efficiently.

Because of these shortcomings, researchers in a number of different fields have pursued a variety of different approaches for improving the efficiency of solar cells. For example, materials researchers have proposed the use of different materials with different band gaps that can be stacked to capture photons with a wider range of energies. Such a "multijunction" solar cell includes a top junction that captures high-energy photons but allows lower-energy photons to pass through to one or more lower-band gap junctions below. Theoretically, efficiencies of 50% could be produced using such an approach. Unfortunately, it is very difficult to stack conventional materials, and matching materials with different crystal lattices is difficult and often impossible, and the actual efficiencies that have been produced thus far have been far less.

Another approach that has been proposed is the use of a "multi-band gap material," wherein a single semiconductor produces multiple band gaps, thereby converting multiple spectral ranges to electricity. By replacing a few of the host atoms in a semiconductor alloy with nitrogen or oxygen atoms having a very different electronegativity, a split band gap can be produced, which in some materials produces a narrow band well below the normal conduction band. The presence of these two separate bands means the material efficiently absorbs photons of three different energies. The difference between the material's valence band and the lower of the split bands forms a first band gap, absorbing photons of a first energy level; the difference between the two split bands is a second band gap, absorbing photons of a second energy level; and the difference between the valence band and the upper conducting band forms a third band gap, absorbing photons of a third energy level. Such an approach could theoretically produce efficiencies in excess of 50%. However, research and development of this approach is still in its infancy, and unfortunately there are significant manufacturing hurdles to be crossed before such an approach will be able to find commercial success.

Another group of researchers, typically involved in the investigation and use of improved manufacturing techniques, has been exploring the use of optically-engineered surface geometries to minimize surface reflection and maximize absorption of light. Most or all of the efforts in this regard have focused on increasing the surface area of the material relative to the volume. For example, porous silicon is a skeleton of single crystalline silicon filled with randomly structured voids that result in a high surface to volume ratio. Thus, any junction built into the structure will have a much larger junction volume (depletion region) proportional to the surface area. However, a significant challenge with porous silicon is the high density of surface states within the porous structure, which leads to carrier recombination at the surface before collection by the electrodes. In other words, carrier removal to improve the efficiency of the solar cell has proven difficult to achieve.

Another group of researchers has been exploring the use of optically-engineered surface geometries to minimize surface reflection and maximize absorption of light. For example, U.S. Patent Application Pub. No. 2009/0295257 discloses the use of a variety of surface features, including an array of surface pyramids, an array of trenches, an array of corrugations, an array of crenulations, an array of nanobowls, and combinations thereof. FIG. 4 is a schematic diagram, in isometric form, of a solar cell 11 having conventional corrugated trenches 20. However, while useful for better capturing or "trapping" light within the solar cell, these geometries are all still relatively crude, more frequently and a need exists for improved surface geometries for greater efficiencies. Furthermore, in part because researchers involved in optically engineering the surfaces of photovoltaic cells are rarely, if ever, materials researchers, the use of surface geometries has not been combined with other techniques to provide greater efficiency improvements. Thus, a need exists for still further improvements in surface geometries as well as in the use of optical engineering with other techniques.

Still another group of researchers, typically involved in materials research rather than manufacturing techniques, have proposed the use of a photon conversion layer, disposed on the top or light-incident side of the solar cell, for converting the wavelength of a portion of the photons received thereby to a different wavelength for better absorption thereof. For example, both U.S. Patent Application Pub. No. 2010/0012177 and U.S. Patent Application Pub. No. 2009/0255577 disclose a photon-conversion layer. However, researchers have only heretofore utilized a single layer, thereby performing down-conversion (from high-energy photons to low-energy photons) or up-conversion (from low-energy photons to high-energy photons) but not both, and no researcher has yet proposed the use of a second such layer on the opposite side of the solar cell. Furthermore, although efficiency improvements may have been achieved using such a single layer, the phosphors or other materials used to cause the energy (wavelength) conversion create additional reflectivity, thereby causing at least some amount of loss in efficiency because of the extra sunlight that is reflected from the surface of the cell. Thus, a need exists for the combination of a down-conversion layer, an up-conversion layer, or both with improved surface geometries to achieve less reflection in combination with an energy (wavelength) conversion process in a solar cell. This, and other needs, are addressed by one or more aspects of the present invention.

SUMMARY OF THE INVENTION

The present invention includes many aspects and features. Moreover, while many aspects and features relate to, and are described in, the context of photovoltaic cells, the present invention is not limited to use only in photovoltaic cells, as will become apparent from the following summaries and detailed descriptions of aspects, features, and one or more embodiments of the present invention.

Broadly defined, the present invention according to a first aspect includes a photovoltaic cell including a junction formed from an n-type semiconductor material and a p-type semiconductor material and having a light-incident side and an opposite side. The photovoltaic cell further includes a trench, opening toward the light-incident side of the junction, for trapping reflected light; a first photon conversion layer that converts photons from a higher energy to a lower energy suitable for absorption by the semiconductor material; and a second photon conversion layer that converts photons from a lower energy to a higher energy suitable for absorption by the semiconductor material.

In features of this aspect, the trench may include a top, a lowermost surface, and at least one plateau elevated above the lowermost surface but disposed below the top of the trench; the trench may further include an additional plateau disposed between the at least one plateau and the top of the trench; the trench may further include an additional plateau disposed between the lowermost surface and the at least one plateau; the at least one plateau may be inclined or declined relative to other surfaces of the trench; and the lowermost surface may be inclined or declined relative to other surfaces of the trench.

In further features of this aspect, the second photon conversion layer may be arranged on the opposite side of the junction; the first photon conversion layer may be arranged on the light-incident side of the junction; the first photon conversion layer may be an antireflective coating layer; the second photon conversion layer may include phosphor particles embedded therein, the phosphor particles selected to convert photons passing through the junction unabsorbed from a lower energy to a higher energy; the phosphor particles may be nano-particles; the phosphor particles may be micro-particles; and the second photon conversion layer may be a reflective coating layer.

In still further features of this aspect, the composition of the first photon conversion layer may be selected to optimize subsequent absorption of the lower-energy photons, converted thereby, by the semiconductor material; the composition of the second photon conversion layer may be selected to optimize subsequent absorption of the higher-energy photons, converted thereby, by the semiconductor material; an upper wall of the trench may be inclined or declined relative to other surfaces of the trench; and a lower wall of the trench may be inclined or declined relative to other surfaces of the trench.

In still further features of this aspect, the photovoltaic cell may further include a hollow, opening toward the opposite side of the junction, for minimizing carrier travel path to one or more contacts, for minimizing attenuation of long wavelength light used for up-conversion, or both; the photovoltaic cell may further include an electrical contact disposed in the hollow; and the second photon conversion layer may be arranged at least partially in the hollow.

In still further features of this aspect, at least a portion of the cross-section or profile of the trench may be hexagonal in shape; the hexagonally-shaped portion of the trench profile may open directly to the light-incident side of the junction; and the hexagonally-shaped portion of the trench profile may open to the light-incident side of the junction via a passage that is narrower than the width of the hexagonally-shaped portion.

Broadly defined, the present invention according to a second aspect includes a photovoltaic cell including a junction formed from an n-type semiconductor material and a p-type semiconductor material and having a light-incident side and an opposite side. The photovoltaic cell further includes a stepped trench, opening toward the light-incident side of the junction, for trapping reflected light, that has a top, a lowermost surface, and at least one plateau elevated above the lowermost surface but disposed below the top of the stepped trench.

In features of this aspect, the stepped trench may further include an additional plateau disposed between the at least one plateau and the top of the stepped trench; and the stepped trench may further include an additional plateau disposed between the lowermost surface and the at least one plateau.

In further features of this aspect, the photovoltaic cell may further include a photon conversion layer; the photon conversion layer may be arranged on the light-incident side of the junction; the photon conversion layer may be a first photon conversion layer, and a second photon conversion layer may be arranged on the opposite side of the junction; the second photon conversion layer may be arranged on the opposite side of the junction; the first photon conversion layer may be arranged on the light-incident side of the junction; the first photon conversion layer may be an anti-reflective coating layer; the second photon conversion layer may include phosphor particles embedded therein, the phosphor particles selected to convert photons passing through the junction unabsorbed from a lower energy to a higher energy; the phosphor particles may be nano-particles; the phosphor particles may be micro-particles; the second photon conversion layer may be a reflective coating layer; the composition of the first photon conversion layer may be selected to optimize subsequent absorption of lower-energy photons, converted by the first photon conversion layer to a higher energy, by the semiconductor material; and the composition of the second photon conversion layer may be selected to optimize subsequent absorption of higher-energy photons, converted by the second photon conversion layer to a lower energy, by the semiconductor material.

In still further features of this aspect, the at least one plateau may be inclined or declined relative to other surfaces of the stepped trench; the lowermost surface may be inclined or declined relative to other surfaces of the stepped trench; an upper wall of the stepped trench may be inclined or declined relative to other surfaces of the stepped trench; and a lower wall of the stepped trench may be inclined or declined relative to other surfaces of the stepped trench.

In still further features of this aspect, the photovoltaic cell may further include a hollow, opening toward the opposite side of the junction, for minimizing carrier travel path to one or more contacts, for minimizing attenuation of long wavelength light used for up-conversion, or both; the photovoltaic cell may further include an electrical contact disposed in the hollow; and a photon conversion layer may be arranged at least partially in the hollow.

Broadly defined, the present invention according to a third aspect includes a photovoltaic cell including a junction formed from an n-type semiconductor material and a p-type semiconductor material and having a light-incident side and an opposite side. The photovoltaic cell further includes a stepped trench, opening toward the light-incident side of the junction, for trapping reflected light. The cross-section or profile of the stepped trench includes a top, a lowermost boundary, and at least one plateau elevated above the lowermost boundary but disposed below the top.

In features of this aspect, the stepped trench may further include an additional plateau disposed between the at least one plateau and the top of the stepped trench; and the stepped trench may further include an additional plateau disposed between the lowermost boundary and the at least one plateau.

In further features of this aspect, the photovoltaic cell may further include a photon conversion layer; the photon conversion layer may be arranged on the light-incident side of the junction; the photon conversion layer may be a first photon conversion layer, and a second photon conversion layer may be arranged on the opposite side of the junction; the first photon conversion layer may be an antireflective coating layer; the second photon conversion layer may include phosphor particles embedded therein, the phosphor particles selected to convert photons passing through the junction unabsorbed from a lower energy to a higher energy; the phosphor particles may be nano-particles; the phosphor particles may be micro-particles; the second photon conversion layer may be a reflective coating layer; the composition of the first photon conversion layer may be selected to optimize subsequent absorption of lower-energy photons, converted by the first photon conversion layer to a higher energy, by the semiconductor material; and the composition of the second photon conversion layer may be selected to optimize subsequent absorption of higher-energy photons, converted by the second photon conversion layer to a lower energy, by the semiconductor material.

In still further features of this aspect, the at least one plateau may be inclined or declined relative to other surfaces of the stepped trench; the lowermost surface may be inclined or declined relative to other surfaces of the stepped trench; an upper wall of the stepped trench may be inclined or declined relative to other surfaces of the stepped trench; and a lower wall of the stepped trench may be inclined or declined relative to other surfaces of the stepped trench.

In still further features of this aspect, the photovoltaic cell may further include a hollow, opening toward the opposite side of the junction, for minimizing carrier travel path to one or more contacts, for minimizing attenuation of long wavelength light used for up-conversion, or both; the photovoltaic cell may further include an electrical contact disposed in the hollow; and a photon conversion layer may be arranged at least partially in the hollow.

Broadly defined, the present invention according to a fourth aspect includes a photovoltaic cell including a junction formed from an n-type semiconductor material and a p-type semiconductor material and having a light-incident side and an opposite side; a trench, opening toward the light-incident side of the junction, for trapping reflected light; and a reflective layer. The reflective layer is disposed on the side of the junction, opposite the light-incident side of the junction, that includes phosphor particles that convert photons which pass through the semiconductor material, without being absorbed, from a lower energy to a higher energy suitable for subsequent absorption by the semiconductor material.

In features of this aspect, the trench may include a top, a lowermost surface, and at least one plateau elevated above the lowermost surface but disposed below the top of the trench; the trench may further include an additional plateau disposed between the at least one plateau and the top of the trench; the trench may further include an additional plateau disposed between the lowermost surface and the at least one plateau; the at least one plateau may be inclined or declined relative to other surfaces of the trench; the lowermost surface may be inclined or declined relative to other surfaces of the trench; an upper wall of the trench may be inclined or declined relative to other surfaces of the trench; a lower wall of the trench may be inclined or declined relative to other surfaces of the trench; the phosphor particles may be nano-particles; the phosphor particles may be micro-particles; and the composition of the reflective layer may be selected to optimize subsequent absorption of the higher-energy photons, converted thereby, by the semiconductor material.

In further features of this aspect, the photovoltaic cell may further include a hollow, opening toward the opposite side of the junction, for minimizing carrier travel path to one or more contacts, for minimizing attenuation of long wavelength light used for up-conversion, or both; the photovoltaic cell may further include an electrical contact disposed in the hollow; and the reflective layer may be arranged at least partially in the hollow.

In still further features of this aspect, at least a portion of the cross-section or profile of the trench may be hexagonal in shape; the hexagonally-shaped portion of the trench profile may open directly to the light-incident side of the junction; and the hexagonally-shaped portion of the trench profile may open to the light-incident side of the junction via a passage that is narrower than the width of the hexagonally-shaped portion.

Broadly defined, the present invention according to a fifth aspect includes a photovoltaic cell including a junction formed from an n-type semiconductor material and a p-type semiconductor material and having a light-incident side and an opposite side. The photovoltaic cell further includes a trench, opening toward the light-incident side of the junction, for trapping reflected light. At least a portion of the cross-section or profile of the trench is hexagonal in shape.

In features of this aspect, the hexagonally-shaped portion of the trench profile may open directly to the light-incident side of the junction; and the hexagonally-shaped portion of the trench profile may open to the light-incident side of the junction via a passage that is narrower than the width of the hexagonally-shaped portion.

In further features of this aspect, the photovoltaic cell may further include a photon conversion layer; the photon conversion layer may be arranged on the light-incident side of the junction; the photon conversion layer may be a first photon conversion layer, and a second photon conversion layer may be arranged on a side of the junction that is opposite the light-incident side; the first photon conversion layer may be an antireflective coating layer; the second photon conversion layer may include phosphor particles embedded therein, the phosphor particles selected to convert photons passing through the junction unabsorbed from a lower energy to a higher energy; the phosphor particles may be nano-particles; the phosphor particles may be micro-particles; the second photon conversion layer may be a reflective coating layer; the composition of the first photon conversion layer may be selected to optimize subsequent absorption of the lower-energy photons, converted thereby, by the semiconductor material; and the composition of the second photon conversion layer may be selected to optimize subsequent absorption of the higher-energy photons, converted thereby, by the semiconductor material.

In still further features of this aspect, the photovoltaic cell may further include a hollow, opening toward a side of the junction that is opposite the light-incident side, for minimizing carrier travel path to one or more contacts, for minimizing attenuation of long wavelength light used for up-conversion, or both; the photovoltaic cell may further include an electrical contact disposed in the hollow; and a photon conversion layer may be arranged at least partially in the hollow.

In addition to the aforementioned aspects and features of the present invention, it should be noted that the present invention further encompasses the various possible combinations and subcombinations of such aspects and features.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
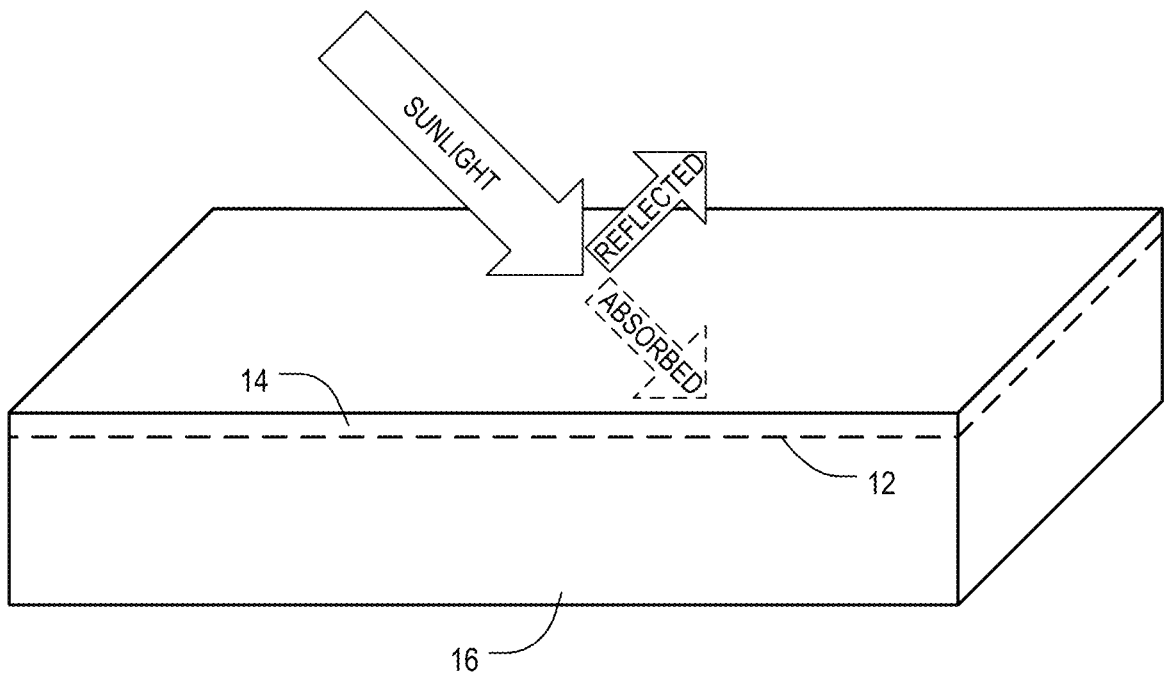
FIG. 1 is a schematic diagram, in isometric form, of a conventional solar cell, including an n-type semiconductor material and a p-type semiconductor material.
Figure 2:
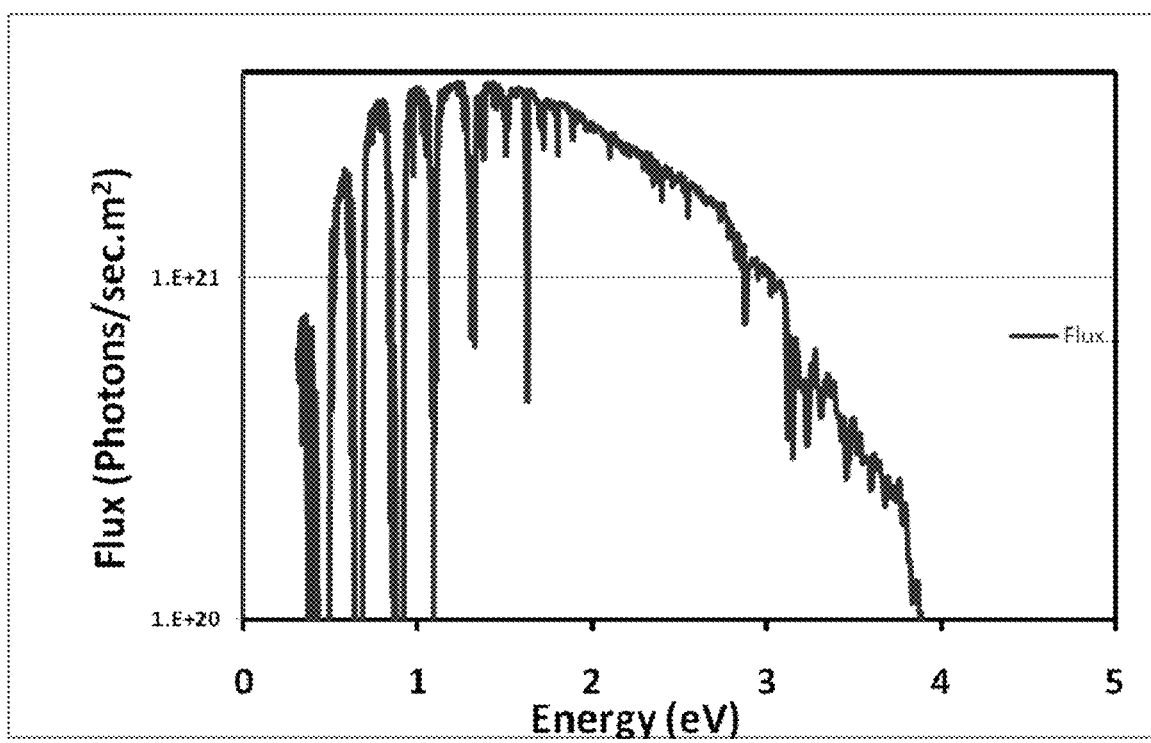
FIG. 2 is a graphical representation of the relative photon energies present in sunlight under standardized conditions.
Figure 3:
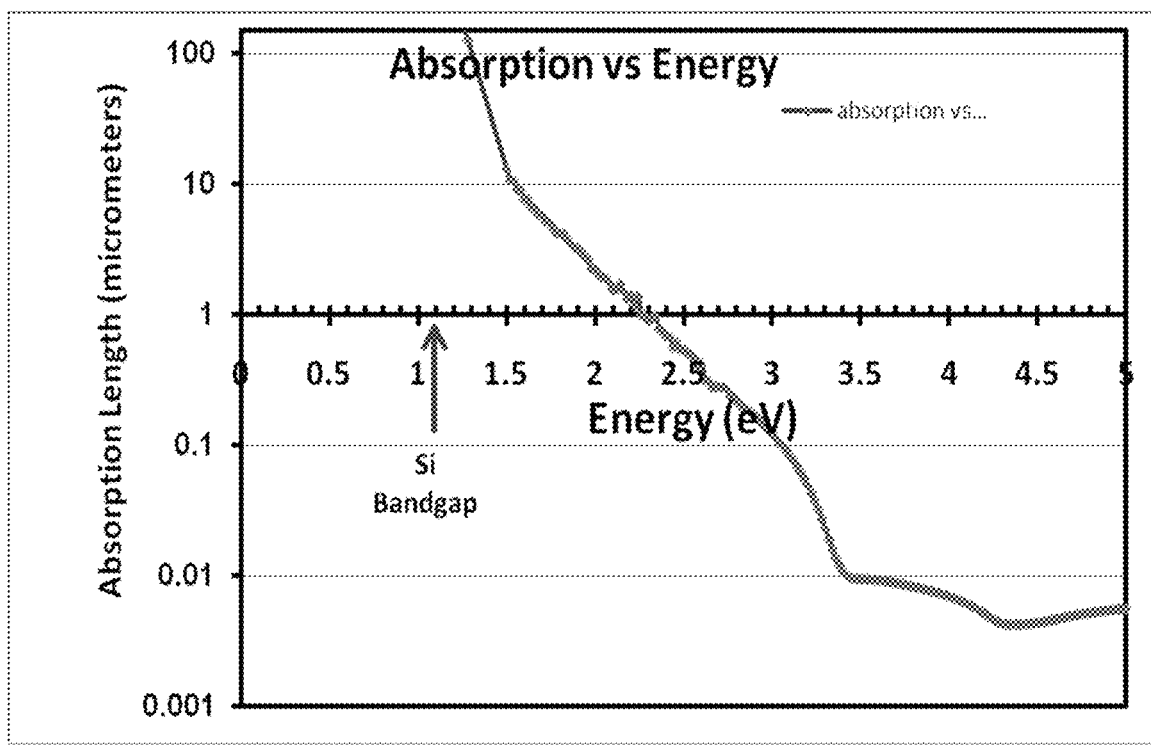
FIG. 3 is a graphical representation illustrating the dependence of silicon absorption depth on light energy.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

Figure 5:
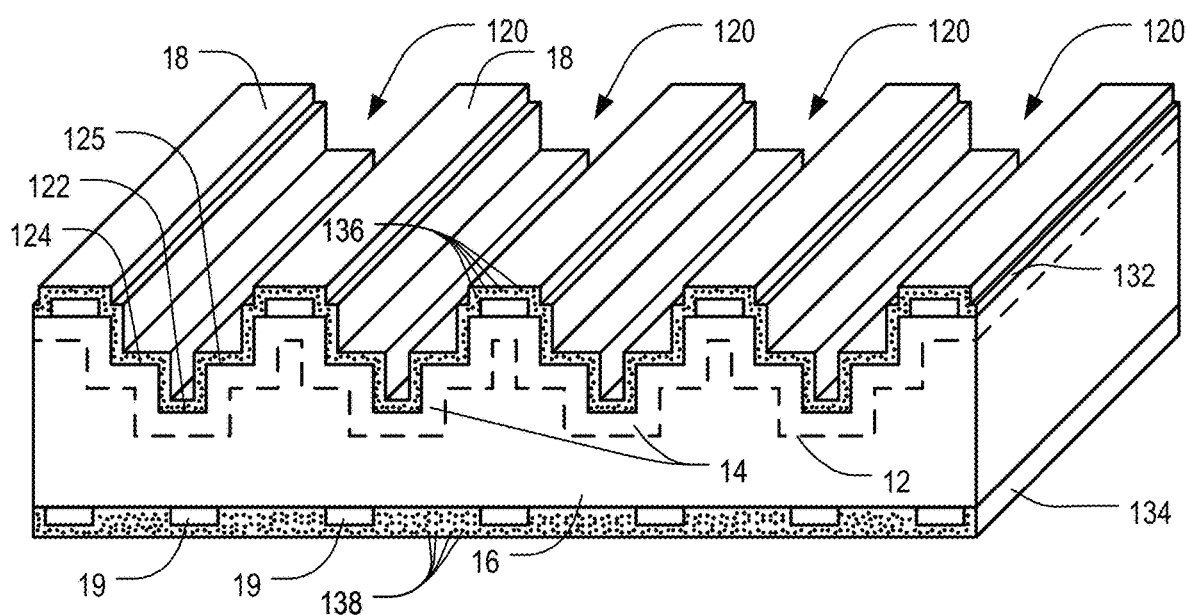
FIGS. 5 and 6 are schematic diagrams, in isometric and cross-sectional form, respectively, of an improved-efficiency solar cell in accordance with a first preferred embodiment of the present invention.
Figure 6:
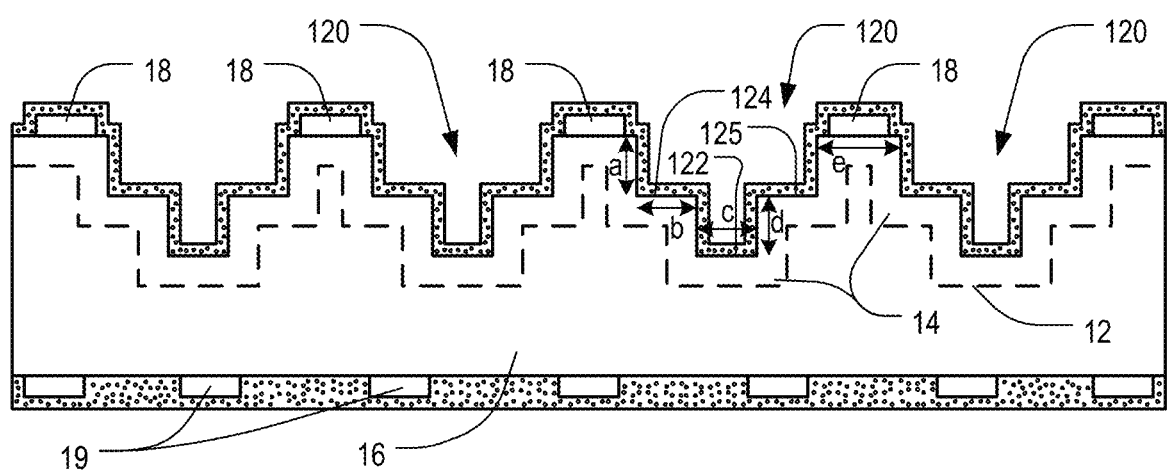

FIGS. 5 and 6 are schematic diagrams, in isometric and cross-sectional form, respectively, of an improved-efficiency solar cell 110 in accordance with a first preferred embodiment of the present invention. As shown therein, the solar cell 110 includes a junction 12 formed from an n-type semiconductor material 14 and a p-type semiconductor material 16 and a plurality of contacts 18,19 providing an electrical connection thereto. The materials selected as the n- and p-type semiconductor materials 14,16 may be of any conventional combination.

Figure 4:
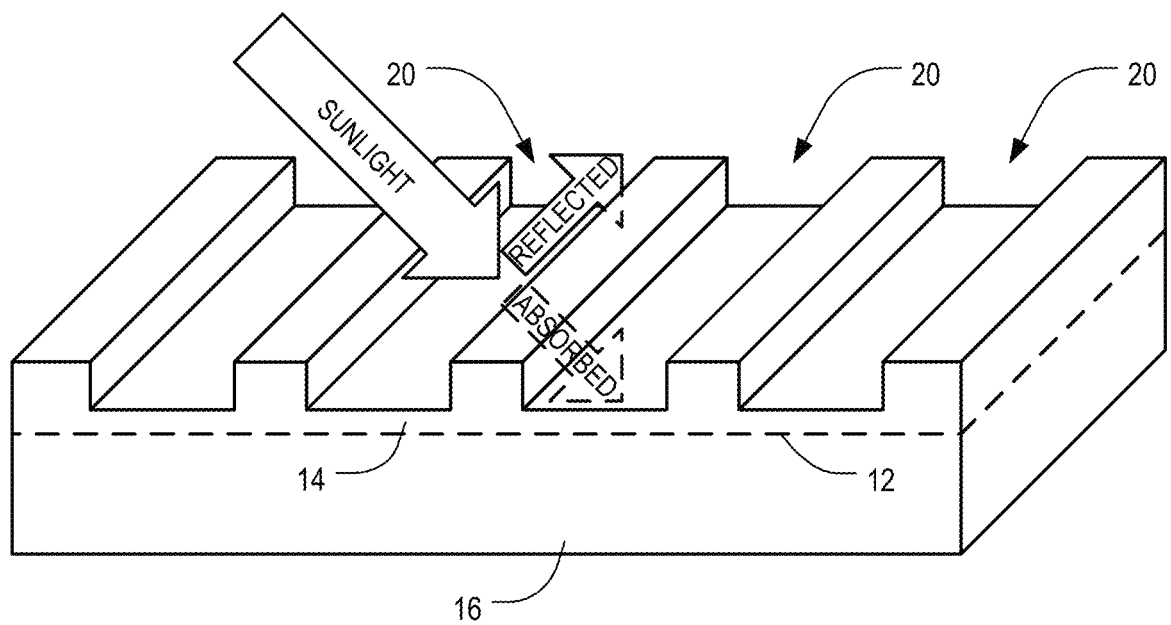
FIG. 4 is a schematic diagram, in isometric form, of a solar cell having conventional corrugated trenches.

The cell 110 includes a series of stepped trenches 120 opening upward, each having a lowermost surface 122 and at least one plateau 124,125 elevated above the lowermost surface 122 but disposed below the top of the trench 120. The arrangement of stepped trenches 120 provides significant improvement with regard to scattering and hence absorption of light with minimal dependence on the radiation's incident angle. Known surface geometries, such as that illustrated in FIG. 4, are able to trap some of the photons that would otherwise be reflected back away from the cell 10 through the use of the walls of the trench 20, which block the upward path of some of the reflected sunlight. However, photons from light falling on central portions of the trenches 20 of the conventional cell 10 of FIG. 4 are lost, while photons from light falling on central portions of the trenches 120 of the solar cell 110 of FIG. 5 fall between the adjacent plateaus 124,125 toward the lowermost surface 122 of the trench 120. Some fall on the lower walls of the trench 120, while others reach the lowermost surface 122 directly. In either case, a portion of the photons are absorbed, and an ever-dwindling portion are reflected, where they are likely to reach yet another surface within the trench 120.

As shown in FIGS. 5 and 6, the cell 110 also includes an antireflective coating layer 132 arranged on the top or front thereof and a reflective coating layer 134 arranged on the bottom or rear thereof. The antireflective coating layer 132 is embedded with nano- and/or micro-particles 136 of one or more down-converting phosphors, while the reflective coating layer 134 is embedded with nano- and/or micro-particles 138 of one or more up-converting phosphors. As used herein, a "down-converting" phosphor is one that transforms high-energy photons to a lower energy, suitable for absorption by the semiconductor material, and an "up-converting" phosphor is one that transforms low-energy photons to a higher energy, suitable for absorption by the semiconductor material.

Figure 7:
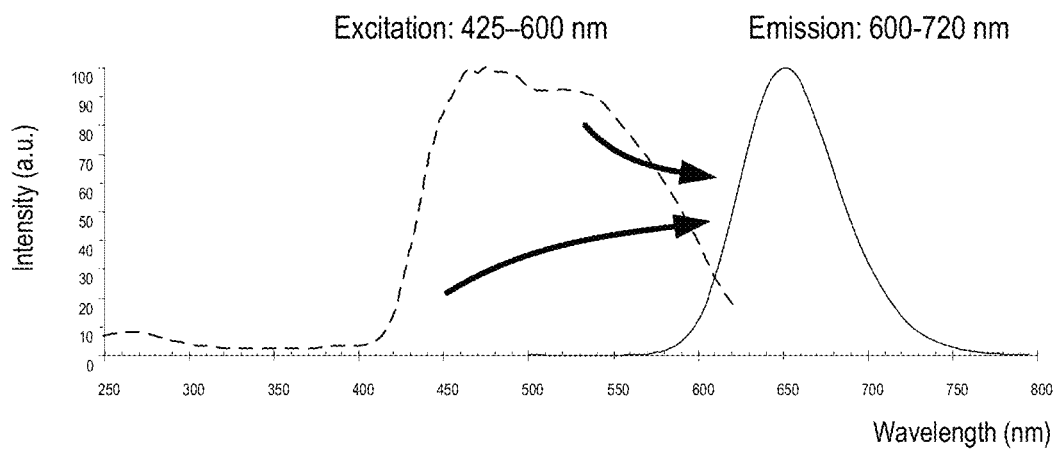
FIG. 7 is a graphical representation of the intensity of the excitation and resulting emission from an exemplary phosphor of photons of various wavelengths.

The down-converting phosphor particles 136 are embedded in the antireflective coating layer 132 with the correct refractive index to minimize emission away from the cell junction 12. FIG. 7 is a graphical representation of the intensity of the excitation and resulting emission from an exemplary phosphor of photons of various wavelengths. In particular, the phosphor whose excitation and emission intensities are illustrated in FIG. 7 is calcium sulphide:europium (CaS:Eu). As shown therein, incident photons with wavelengths in the range of about 425-600 nm (E=2.9 eV to 2 eV) is converted to an emission centered around 660 nm (E=1.88 eV). It will be appreciated that although the incident photons in this example are on the lower edge of, but still within, the visible light spectrum, other phosphors are excited by photons in the ultraviolet portion of the spectrum and emit photons in the visible light spectrum, and that phosphors suitable for use in the antireflective coating layer 132 may be selected without undue experimentation by the Ordinary Artisan.

Figure 8:
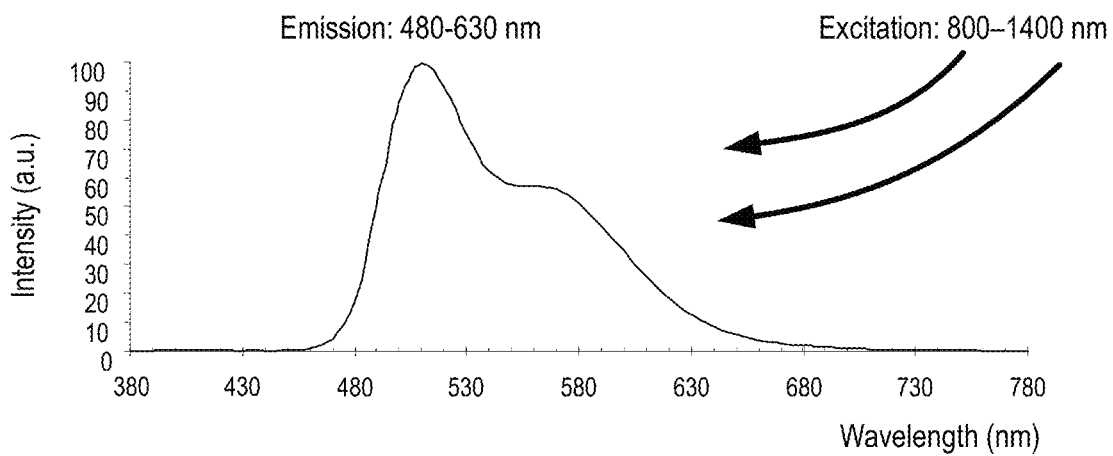
FIG. 8 is a graphical representation of the intensity of the emission resulting from an exemplary phosphor of photons of wavelengths between about 800 and 1400 nm.

The up-converting phosphor particles 138 are embedded in the reflective coating layer 134 to maximize reflection of high-energy, long-wavelength photons back toward the cell junction 12. FIG. 8 is a graphical representation of the intensity of the emission resulting from an exemplary phosphor of photons of wavelengths between about 800 and 1400 nm (not shown). In particular, the phosphor whose excitation and emission intensities are illustrated in FIG. 7 is calcium sulphide:europium (CaS:Eu). As shown therein, incident photons with wavelengths in the range of about 800-1400 nm (E=0.88 to 1.55 eV) is converted to a broad emission centered around 510 nm (E=2.4 eV). It will be appreciated that the phosphor whose excitation and emission properties are illustrated in FIG. 8 is merely an example, and that phosphors suitable for use in the reflective coating layer 134 may be selected without undue experimentation by the Ordinary Artisan.

Figure 9:
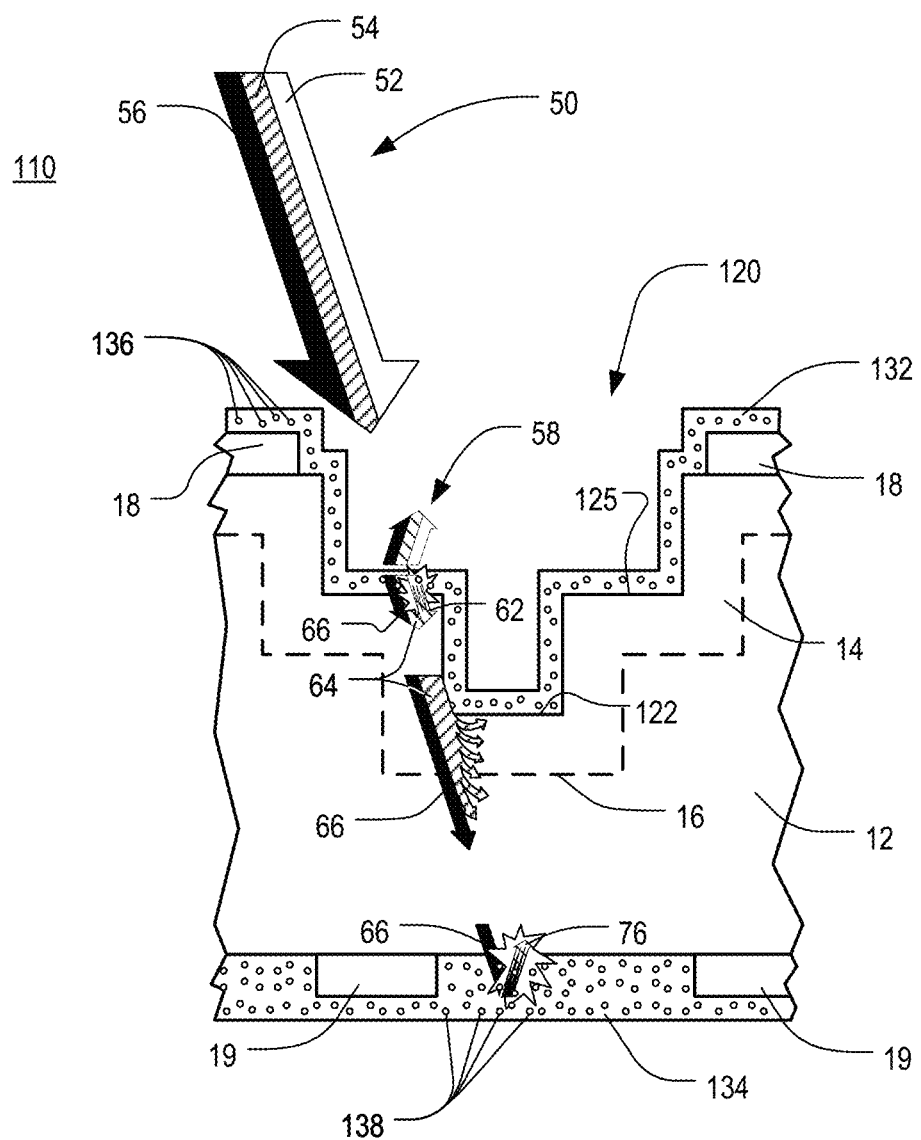
FIGS. 9 and FIG. 10 are enlarged cross-sectional views of a portion of the cell of FIG. 6 illustrating the improved operational efficiencies thereof.
Figure 10:
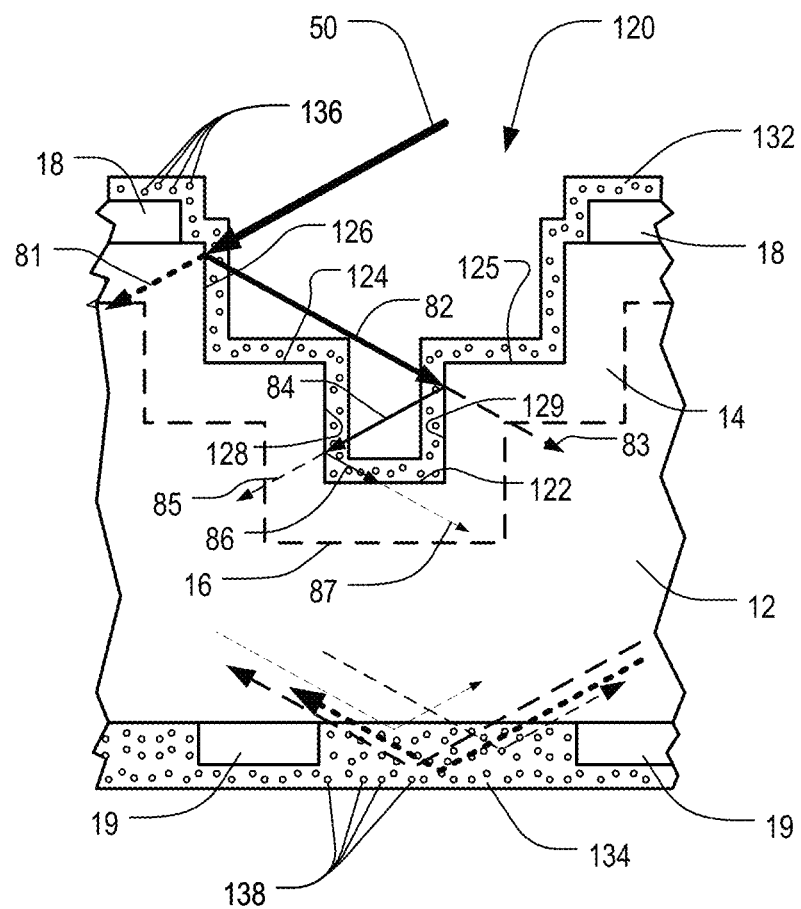

FIG. 9 and FIG. 10 are enlarged cross-sectional views of a portion of the cell 110 of FIG. 6 illustrating the improved operational efficiencies thereof. More particularly, FIG. 9 illustrates the use of down-conversion and up-conversion phosphor particles 136,138 to absorb and utilize photons from a greater portion of the electromagnetic spectrum, while FIG. 10 illustrates the use of improved surface geometry to capture a greater portion of the photons falling on the surface of the cell 110.

As shown in FIG. 9, sunlight 50 falling on the top or front surface of the cell 110 includes an ultraviolet component 52, a visible light component 54 and an infrared component 56. Although reflection may be minimized through the use of the antireflective layer 134, a portion 58 of the sunlight may be reflected from the surface of the cell 110. It will be appreciated that the phosphor particles 136 embedded in the antireflective layer 132 may cause reflection of their own, but because the particles 136 are so small and make up a relatively small portion of the layer 132, this effect is expected to be relatively small. Furthermore, although some of the reflected sunlight 58 will inevitably escape altogether, the improved surface geometry of the cell 110 will enable much of it to be captured elsewhere in the cell 110, as described with regard to FIG. 10. Thus, additional reflectivity caused by the presence of the particles is more than counterbalanced by the improved surface geometry.

As the sunlight passes through the antireflective layer 132, the down-conversion phosphor particles 136 embedded therein transform or convert high-energy photons, such as those in the ultraviolet component 52 of the sunlight, to lower energy photons that preferably match optional absorption in the semiconductor material. The resulting lower-energy photons 62 join the visible light component 64 and the infrared component 66 in passing into the semiconductor material. There, the photons whose energy is in the band gap for the material are absorbed, generating electron-hole pairs which are driven to the contacts by the built-in field. Thus, a greater amount of photons in the energy range of visible light 64 passes into the semiconductor material for absorption therein than in the absence of the down-conversion particles 136.

The semiconductor material is almost transparent to photons with energies lower than its band gap, such as infrared photons having long wavelengths. Most of this component 66 thus passes completely through the semiconductor material to the bottom or rear thereof, at which point they encounter the reflective layer 134 disposed there. Most or all of the infrared photons are then reflected back into the bottom or rear of the semiconductor material, but as they pass into or through portions of the reflective layer 134, the up-conversion phosphor particles 138 embedded therein transform or convert low-energy photons, such as those in the infrared component 66, to higher energy photons that preferably match optional absorption in the semiconductor material. It is the resulting higher-energy photons 76 that pass back into the semiconductor material. There, the photons whose energy is in the band gap for the material, which at this point is most of the photons, are absorbed, generating electron-hole pairs which are driven to the contacts by the built-in field. Thus, low-energy photons that would otherwise pass through the semiconductor material and be lost are instead converted to the energy range of visible light and pass once again into the semiconductor material for absorption therein.

The down-conversion and up-conversion of photons of high and low energy, respectively, is further enhanced through the use of the improved surface geometry. Sunlight 50 falling on the top or front the cell 110 may strike any of a variety of faces thereof, including a top or front of a contact, walls or plateaus 124,125 in a trench 120, or even the bottom surface 122 of a trench 120. Although reflection may be minimized through the use of the antireflective layer 134, a portion 58 of the sunlight may be reflected, regardless of where it strikes. In this regard, it will once again be appreciated that the phosphor particles 136 embedded in the antireflective layer 132 may cause reflection of their own, but because the particles 136 are so small and make up a relatively small portion of the layer 132, this effect is expected to be relatively small. Furthermore, although some of the reflected sunlight 58 will inevitably escape altogether, the improved surface geometry of the cell 110 will enable much of it to be captured elsewhere in the cell 110, as described with regard to FIG. 10. Thus, additional reflectivity caused by the presence of the particles is more than counterbalanced by the improved surface geometry.

It will further be appreciated that an infinite range of possible strike locations and angles will be encountered in practice. Nonetheless, an exemplary angle and strike location are illustrated in FIG. 10 in order to illustrate some of the utility of the arrangement of the present invention. In particular, the sunlight 50 in FIG. 10 is shown striking an upper wall 126 of a trench 120 of the cell 110. A substantial portion 81 of this sunlight passes through the antireflective layer 132, with high-energy photons being transformed or converted by phosphor particles 136 embedded therein and electron-hole pairs being generated by photons with energies in the band gap of the semiconductor material, as described above and illustrated in FIG. 9. A portion 82 of the sunlight, however, is reflected away from the wall 126 at an angle dependent, at least in substantial part, on the angle with which the sunlight 50 struck the upper wall 126. In the illustrated example, this reflected portion 82 next strikes a lower wall 129 of the trench 120. Once again, a substantial portion 83 of this reflected sunlight 82 passes through the antireflective layer 132, with subsequent generation of electron-hole pairs as described previously. A portion 84, however, is once again reflected away from the wall 129. In the illustrated example, this reflected portion 84 next strikes the opposite lower wall 128 of the trench 120. Yet again, a substantial portion 85 of this reflected sunlight 84 passes through the antireflective layer 132, with subsequent generation of electron-hole pairs as described previously, and yet again, a portion 86 being reflected away from the wall 128. In the illustrated example, this reflected portion 86 next strikes the lowermost surface 120 of the trench 120. Yet still again, a substantial portion 87 of this reflected sunlight 86 passes through the antireflective layer 132, with subsequent generation of electron-hole pairs as described previously. It will be appreciated that at this point, a remaining portion (not illustrated) of the reflected sunlight 86 would be reflected upward, but that it would likely encounter one of the lower walls of the trench 120 yet again. Indeed, it is possible, depending upon the angle and location of the original sunlight 50, that almost the entirety of the original sunlight is eventually captured within the cell 110, with each succeeding reflection creating yet another opportunity to capture a remaining portion of the reflected light.

As will be appreciated, some of the photons that pass into the semiconductor material will be of insufficient energy to be absorbed in the semiconductor material and may pass all the way through. These, in turn, may be reflected back upward by the reflective layer 134 at the bottom or rear of the cell 110, as illustrated at the bottom of FIG. 10 and described and illustrated in more detail previously.

Referring again to FIG. 6, it will be appreciated that the dimensions of the various features of the trenches 120, including those denoted with letters "a," "b," "c," "d" and "e," may be varied without departing from the scope of the present invention. Furthermore, the dimensions, shapes and relative sizes of the various structures shown in FIGS. 5 and 6 are illustrative only, and may likewise be varied without departing from the scope of the present invention. For example, although the lowermost surface 122, plateaus 124,125 and upper and lower walls 126,129 of the trenches 120 are illustrated as being parallel and perpendicular to one another, each such surface may be inclined or declined relative to the axes of the trench 120 without departing from the scope of the current invention.

Figure 11:
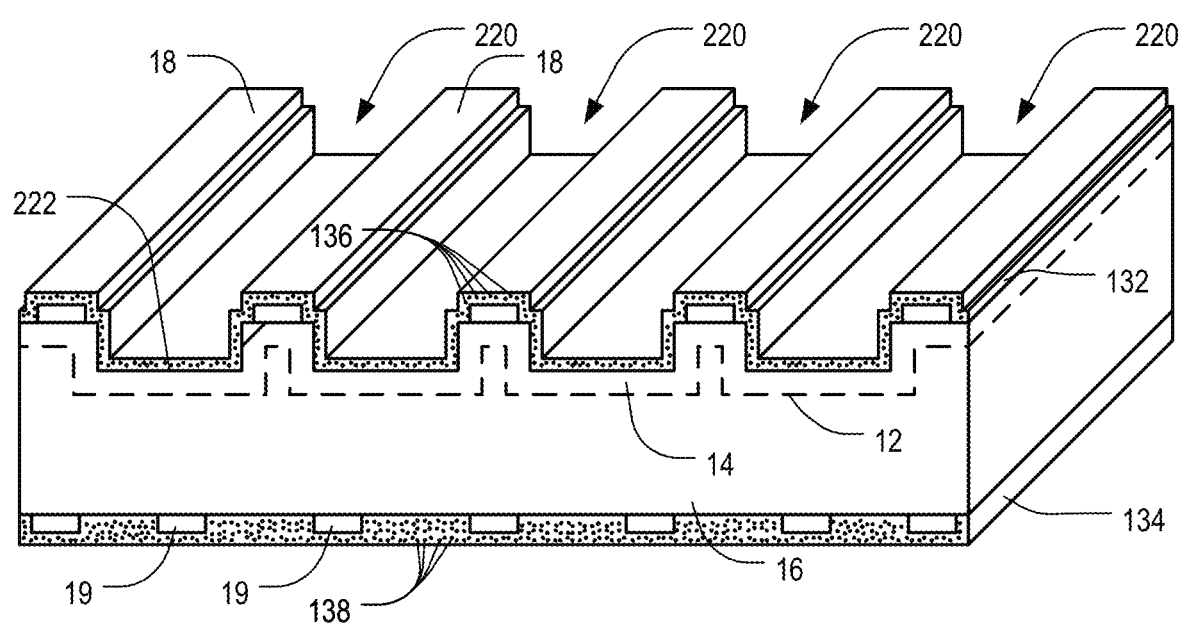
FIGS. 11 and 12 are schematic diagrams, in isometric and cross-sectional form, respectively, of an improved-efficiency solar cell in accordance with a second preferred embodiment of the present invention.
Figure 12:
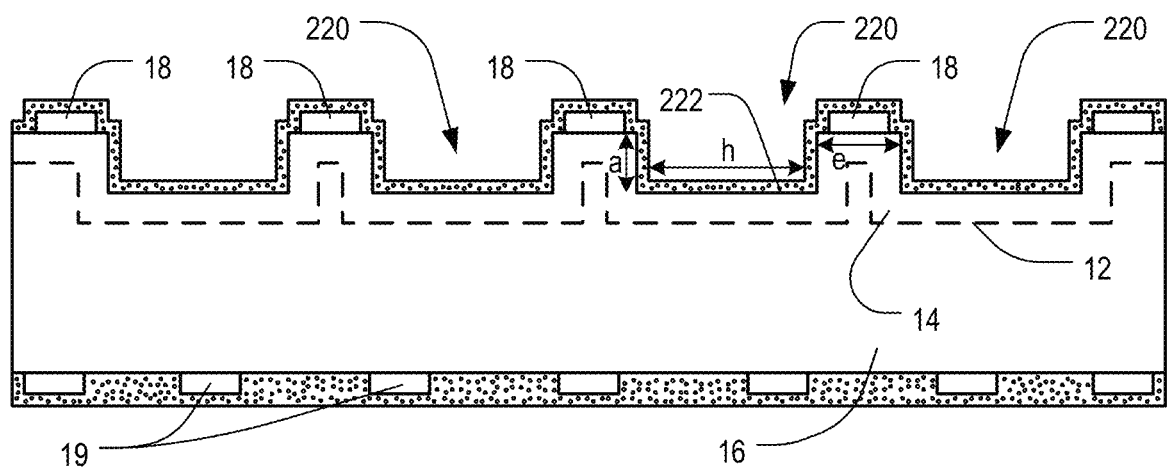

An antireflective layer 132 in which down-conversion phosphor particles 136 are embedded may be applied to solar cells having other non-planar top or front surfaces as well. FIGS. 11 and 12 are schematic diagrams, in isometric and cross-sectional form, respectively, of an improved-efficiency solar cell 210 in accordance with a second preferred embodiment of the present invention. As shown therein, the solar cell 210 includes a junction 12 formed from an n-type semiconductor material 14 and a p-type semiconductor material 16 and a plurality of contacts 18,19 providing an electrical connection thereto. As with the solar cell 110 of FIGS. 5 and 6, the materials selected as the n- and p-type semiconductor materials 14,16 may be of any conventional combination.

The cell 210 includes a series of conventional trenches 220 opening upward, each having a lowermost surface 222 disposed below the top of the trench 220. Like the cell 110 of FIGS. 5 and 6, the cell 210 of FIGS. 11 and 12 also includes an antireflective coating layer 132 arranged on the top or front thereof and a reflective coating layer 134 arranged on the bottom or rear thereof. The antireflective coating layer 132 is embedded with nano- and/or micro-particles 136 of one or more down-converting phosphors, while the reflective coating layer 134 is embedded with nano- and/or micro-particles 138 of one or more up-converting phosphors. Although not as effective in capturing reflected sunlight as the cell 110 having the improved surface geometry shown in FIGS. 5 and 6, the cooperation of the corrugated trenches 220 with the antireflective and reflective layers 132,134 having, respectively, down-converting and up-converting phosphor particles embedded therein nonetheless represents a significant improvement in efficiency over prior art solar cells 10,11.

Referring again to FIG. 12, it will be appreciated that the dimensions of the various features of the trenches 220, including those denoted with letters "a," "e" and "h," may be varied without departing from the scope of the present invention. Furthermore, the dimensions, shapes and relative sizes of the various structures shown in FIGS. 11 and 12 are illustrative only, and may likewise be varied without departing from the scope of the present invention. For example, although the lowermost surfaces 222 of the trenches 220 are illustrated as being parallel to one another, each such surface may be inclined or declined relative to the axes of the trench 220 without departing from the scope of the current invention.

Figure 13:
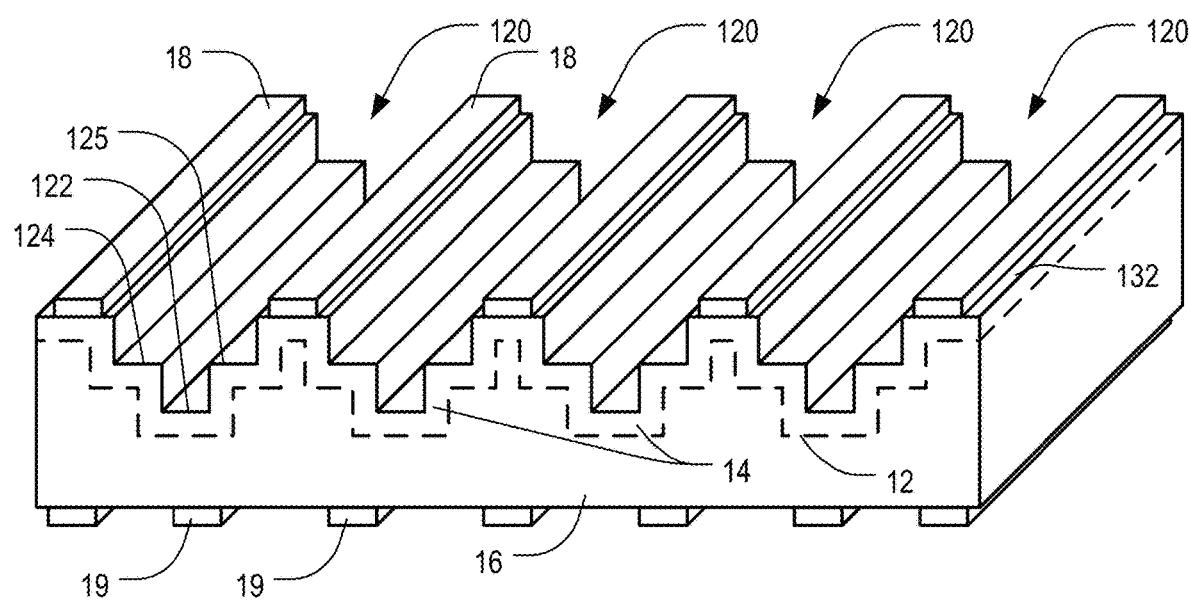
FIGS. 13 and 14 are schematic diagrams, in isometric and cross-sectional form, respectively, of a solar cell having only the optically designed surface for improved angle-independent absorption of light in accordance with a third preferred embodiment of the present invention.
Figure 14:
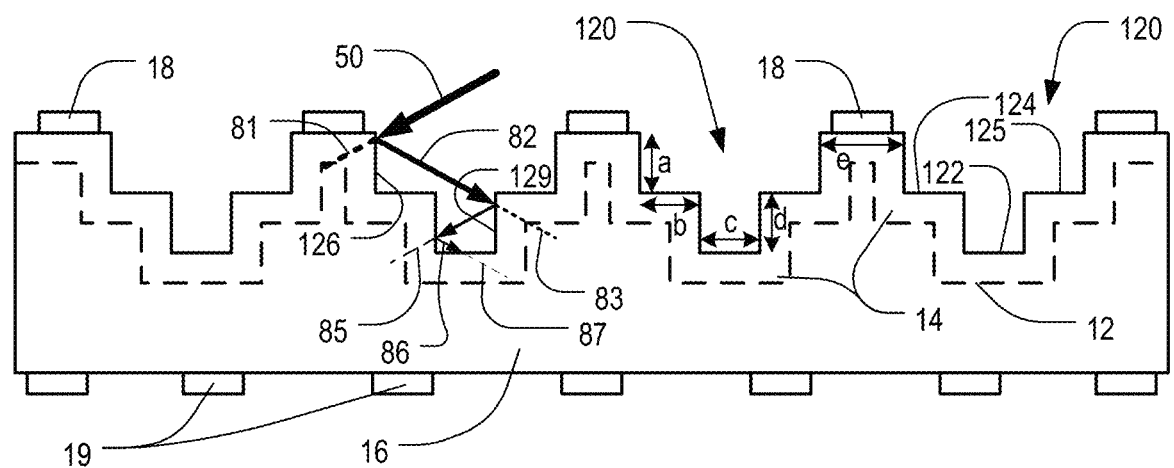

The improved surface geometry may also be utilized without the antireflective down-conversion layer 132, the reflective up-conversion layer 134, or both, while still gaining some benefit from the improved amount of sunlight captured thereby. FIGS. 13 and 14 are schematic diagrams, in isometric and cross-sectional form, respectively, of a solar cell 310 having only the optically designed surface for improved angle-independent absorption of light in accordance with a third preferred embodiment of the present invention. As shown therein, the solar cell 310 again includes a junction 12 formed from an n-type semiconductor material 14 and a p-type semiconductor material 16 and a plurality of contacts 18,19 providing an electrical connection thereto. As with the previous solar cells 110,210, the materials selected as the n- and p-type semiconductor materials 14,16 may be of any conventional combination.

Similar to the cell 110 of FIGS. 5 and 6, the cell 310 of FIGS. 13 and 14 includes a series of stepped trenches 120 opening upward, each having a lowermost surface 122 and at least one plateau 124,125 elevated above the lowermost surface 122 but disposed below the top of the trench 120. In an illustrative example, sunlight 50 falling on an upper wall of the trench is reflected back and forth as more and more of it is gradually absorbed into the junction area, similar to the reflection and absorption of light described with regard go FIG. 10. Again, the arrangement of stepped trenches 120 provides significant improvement with regard to scattering and hence absorption of light with minimal dependence on the radiation's incident angle. Known surface geometries, such as that illustrated in FIG. 4, are able to trap some of the photons that would otherwise be reflected back away from the cell 10 through the use of the walls of the trench 20, which block the upward path of some of the reflected sunlight. However, photons from light falling on central portions of the trenches 20 of the conventional cell 10 of FIG. 4 are lost, while photons from light falling on central portions of the trenches 120 of the solar cell 310 of FIG. 13 fall between the adjacent plateaus 124,125 toward the lowermost surface 122 of the trench 120. Some fall on the lower walls of the trench 120, while others reach the lowermost surface 122 directly. In either case, a portion of the photons are absorbed, and an ever-dwindling portion are reflected, where they are likely to reach yet another surface within the trench 120.

Referring again to FIG. 14, it will be appreciated that the dimensions of the various features of the trenches 120, including those denoted with letters "a," "b," "c," "d" and "e," may be varied without departing from the scope of the present invention. Furthermore, the dimensions, shapes and relative sizes of the various structures shown in FIGS. 13 and 14 are illustrative only, and may likewise be varied without departing from the scope of the present invention. For example, although the lowermost surface 122, plateaus 124,125 and upper and lower walls 126,129 of the trenches 120 are illustrated as being parallel and perpendicular to one another, each such surface may be inclined or declined relative to the axes of the trench 120 without departing from the scope of the current invention.

In at least one embodiment, an additional plateau (not illustrated) may be disposed in any of the trenches 120 between either or both of the first and second plateaus 124,125 and the top of the trench 120, between either or both of the first and second plateaus 124,125 and the lowermost surface 122, or both.

Figure 15:
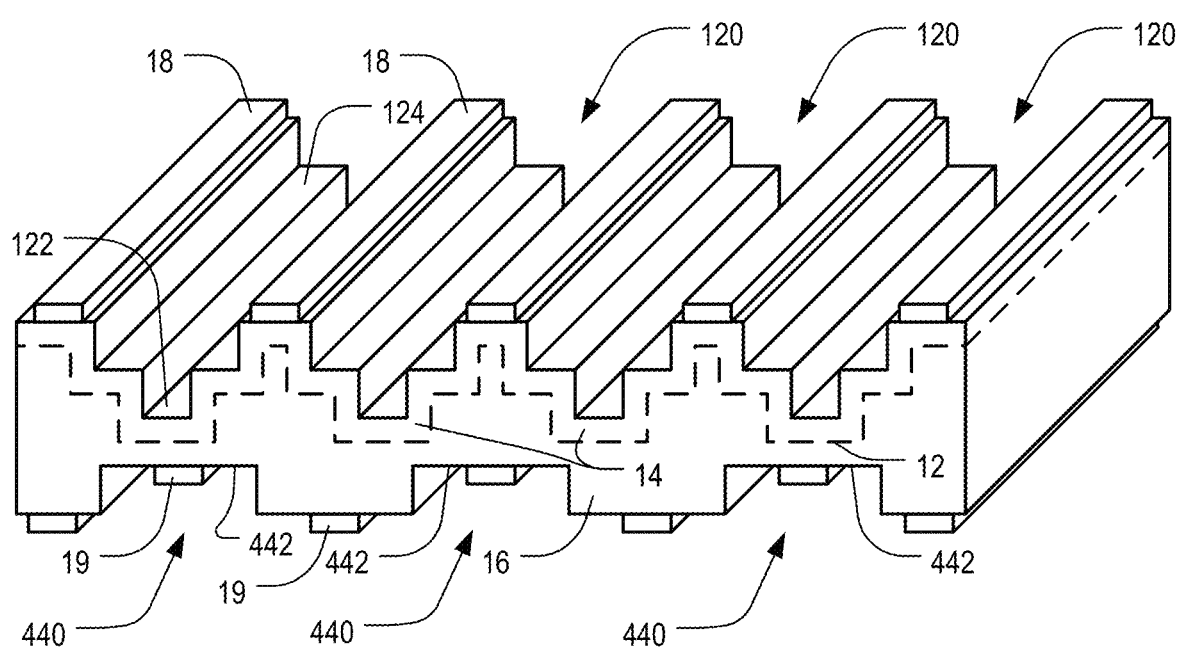
FIGS. 15 and 16 are schematic diagrams, in isometric and cross-sectional form, respectively, of a solar cell having an improved rear or bottom surface geometry in accordance with a fourth preferred embodiment of the present invention.
Figure 16:
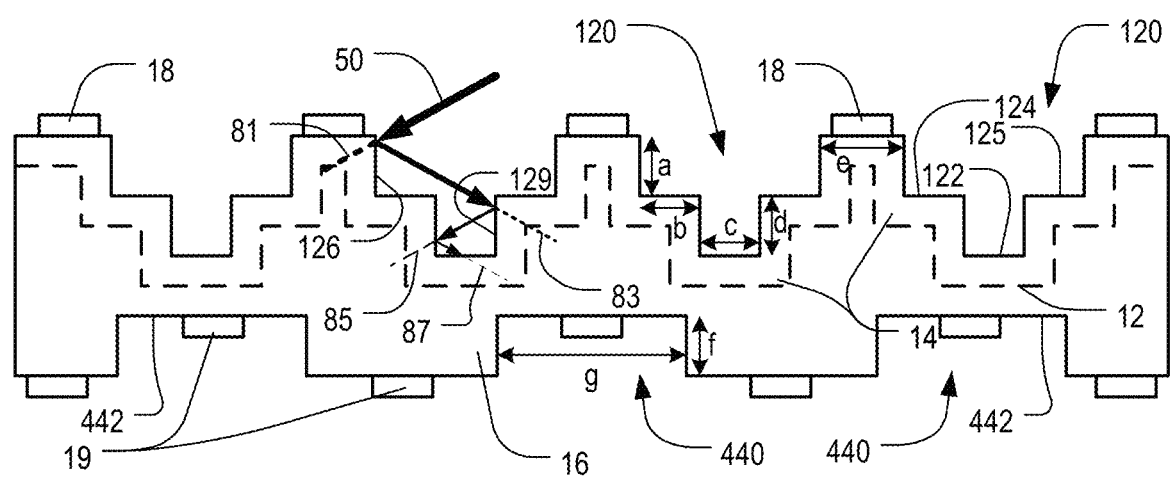

FIGS. 15 and 16 are schematic diagrams, in isometric and cross-sectional form, respectively, of a solar cell 410 having an improved rear or bottom surface geometry in accordance with a fourth preferred embodiment of the present invention. In particular, the solar cell 410 of FIGS. 15 and 16 is similar to that of FIGS. 13 and 14, but whose bottom or rear includes a series of hollows 440 opening downward, each having an upper surface 442. These hollows 440, which may be created via etching during the manufacturing process, may optionally be utilized to minimize carrier travel path to some or all of the contacts 19, to minimize attenuation of long wavelength light used for up-conversion at the back of the cell, or both. The lower surface has a large surface-to-volume ratio, which, in turn, results in maximizing the volume of the depletion region at the p-n junction 12. Carriers generated at the p-n junction 12 are driven by the built in potential towards the contacts 19. Since the solar cell current is proportional to the volume of the depletion region, this design will assist in enhancing the efficiency of the cell 410.

Referring again to FIG. 14, it will be appreciated that the dimensions of the various features of the trenches 120, including those denoted with letters "a," "b," "c," "d," "e," "f" and "g," may be varied without departing from the scope of the present invention. Furthermore, the dimensions, shapes and relative sizes of the various structures shown in FIGS. 15 and 16 are illustrative only, and may likewise be varied without departing from the scope of the present invention. For example, although the lowermost surface 122, plateaus 124,125 and upper and lower walls 126,129 of the trenches 120 are illustrated as being parallel and perpendicular to one another, each such surface may be inclined or declined relative to the axes of the trench 120 without departing from the scope of the current invention.

It will be further appreciated that the actual surface geometry may have a shape and profile that are determined by available algorithms and are preferably based on optical design parameters such as the refractive index of the solar cell. The surface may be fabricated using conventional diffractive optics techniques, including nano-imprinting. Furthermore, because reflection is minimized, the need for a mechanical tracking system to keep the cell directed toward the sun may be obviated or reduced.

In another feature, the capture of light by the cell 110, 210,310,410 may be further improved by etching cavities under the surface.

Figure 17:
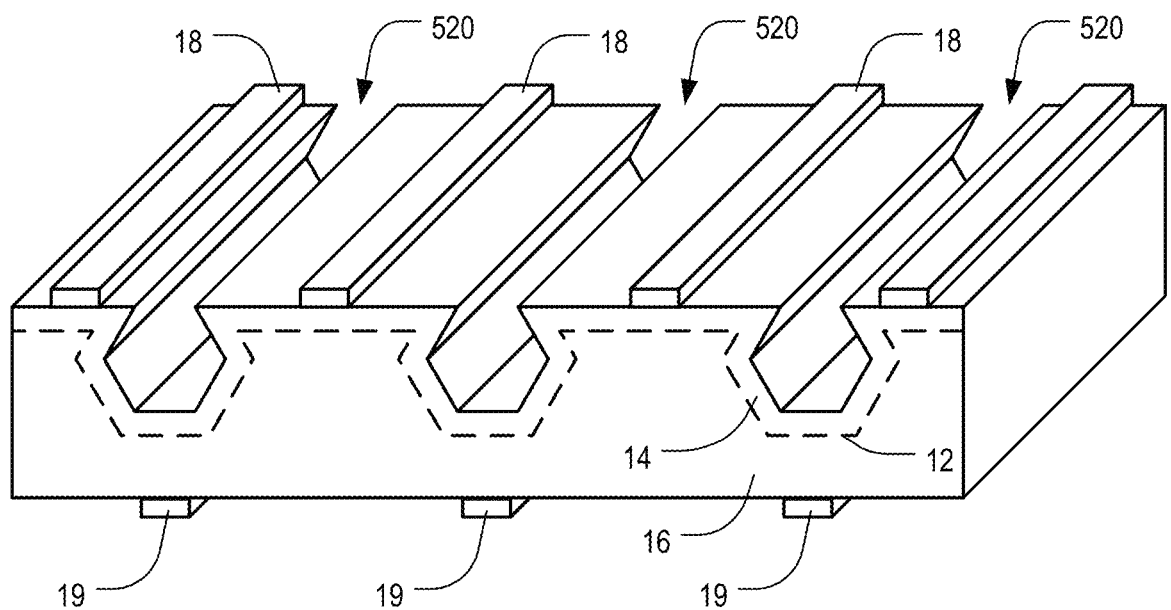
FIG. 17 is a schematic diagram, in isometric form, of a solar cell having another optically designed surface for improved angle-independent absorption of light in accordance with a fifth preferred embodiment of the present invention.

FIG. 17 is a schematic diagram, in isometric form, of a solar cell 510 having another optically designed surface for improved angle-independent absorption of light in accordance with a fifth preferred embodiment of the present invention. In particular, the solar cell 510 of FIG. 17 is similar to that of FIGS. 13 and 14, but whose trenches 520 have a hexagonal cross-section or profile. As will be appreciated, direct or reflected sunlight entering the trenches 520 will be reflected differently than that entering the stepped trenches 120 of the solar cell 310 of FIGS. 13 and 14, and light that finds its way into these trenches 520 may be even less likely to escape than light entering the stepped trenches 120.

It will also be appreciated that although not illustrated, down- and up-conversion layers 132,134 of the type described previously may be included with the solar cell 510 of FIG. 17 in at least some embodiments, and furthermore that hollows 440 optionally may be included in the bottom or rear surface as well. Still further, it will be appreciated that the dimensions of the various features of the trenches 520 may be varied without departing from the scope of the present invention, and that the dimensions, shapes and relative sizes of the various structures shown in FIG. 17 are illustrative only, and may likewise be varied without departing from the scope of the present invention.

Figure 18:
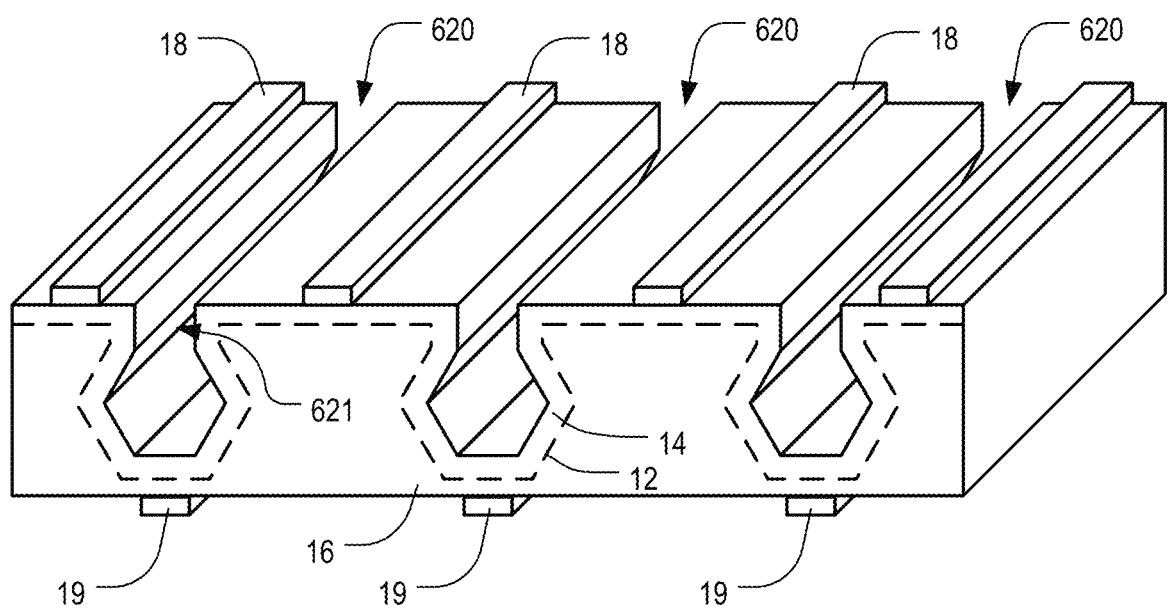
FIG. 18 is a schematic diagram, in isometric form, of a solar cell having another optically designed surface for improved angle-independent absorption of light in accordance with a sixth preferred embodiment of the present invention.

FIG. 18 is a schematic diagram, in isometric form, of a solar cell 610 having another optically designed surface for improved angle-independent absorption of light in accordance with a sixth preferred embodiment of the present invention. In particular, the solar cell 610 of FIG. 18 is similar to that of FIG. 17, but whose hexagonal trenches 620 are positioned deeper beneath the top or front surface and are connected to the surface via a narrower passage 621. As will be appreciated, direct or reflected sunlight entering the trenches 620 will be reflected differently than that entering the stepped trenches 120 of the solar cell 310 of FIGS. 13 and 14, and light that finds its way into these trenches 620 may be even less likely to escape than light entering the stepped trenches 120.

It will also be appreciated that although not illustrated, down- and up-conversion layers 132,134 of the type described previously may be included with the solar cell 610 of FIG. 18 in at least some embodiments, and furthermore that hollows 440 optionally may be included in the bottom or rear surface as well. Still further, it will be appreciated that the dimensions of the various features of the trenches 620 may be varied without departing from the scope of the present invention, and that the dimensions, shapes and relative sizes of the various structures shown in FIG. 18 are illustrative only, and may likewise be varied without departing from the scope of the present invention.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A photovoltaic cell comprising:
a junction formed from an n-type semiconductor material and a p-type semiconductor material and having a light-incident side and an opposite side;
a trench, opening toward the light-incident side of the junction, for trapping reflected light; and
a reflective layer, disposed on the side of the junction, opposite the light-incident side of the junction, that includes phosphor particles that convert photons which pass through the semiconductor material, without being absorbed, from a lower energy to a higher energy suitable for subsequent absorption by the semiconductor material;
wherein the trench includes a top, a lowermost surface, and at least one plateau elevated above the lowermost surface but disposed below the top of the trench; and
wherein the at least one plateau is inclined or declined relative to other surfaces of the trench.

2. The photovoltaic cell of claim 1, wherein the trench further includes an additional plateau disposed between the at least one plateau and the top of the trench.

3. The photovoltaic cell of claim 1, wherein the trench further includes an additional plateau disposed between the lowermost surface and the at least one plateau.

4. The photovoltaic cell of claim 1, wherein the phosphor particles are nano-particles.

5. The photovoltaic cell of claim 1, wherein the phosphor particles are micro-particles.

6. The photovoltaic cell of claim 1, wherein the composition of the reflective layer is selected to optimize subsequent absorption of the higher-energy photons, converted thereby, by the semiconductor material.

7. The photovoltaic cell of claim 1, further comprising a hollow, opening toward the opposite side of the junction, for minimizing carrier travel path to one or more contacts, for minimizing attenuation of long wavelength light used for up-conversion, or both.

8. The photovoltaic cell of claim 7, further comprising an electrical contact disposed in the hollow.

9. The photovoltaic cell of claim 7, wherein the reflective layer is arranged at least partially in the hollow.

10. A photovoltaic cell comprising:
a junction formed from an n-type semiconductor material and a p-type semiconductor material and having a light-incident side and an opposite side;
a trench, opening toward the light-incident side of the junction, for trapping reflected light; and
a reflective layer, disposed on the side of the junction, opposite the light-incident side of the junction, that includes phosphor particles that convert photons which pass through the semiconductor material, without being absorbed, from a lower energy to a higher energy suitable for subsequent absorption by the semiconductor material;
wherein the trench includes a top, a lowermost surface, and at least one plateau elevated above the lowermost surface but disposed below the top of the trench; and
wherein the lowermost surface is inclined or declined relative to other surfaces of the trench.

11. The photovoltaic cell of claim 10, wherein the trench further includes an additional plateau disposed between the at least one plateau and the top of the trench.

12. The photovoltaic cell of claim 10, wherein the trench further includes an additional plateau disposed between the lowermost surface and the at least one plateau.

13. The photovoltaic cell of claim 10, wherein the phosphor particles are nano-particles.

14. The photovoltaic cell of claim 10, wherein the phosphor particles are micro-particles.

15. The photovoltaic cell of claim 10, wherein the composition of the reflective layer is selected to optimize subsequent absorption of the higher-energy photons, converted thereby, by the semiconductor material.

16. The photovoltaic cell of claim 10, further comprising a hollow, opening toward the opposite side of the junction, for minimizing carrier travel path to one or more contacts, for minimizing attenuation of long wavelength light used for up-conversion, or both.

17. The photovoltaic cell of claim 16, further comprising an electrical contact disposed in the hollow.

18. The photovoltaic cell of claim 16, wherein the reflective layer is arranged at least partially in the hollow.

19. A photovoltaic cell comprising:
a junction formed from an n-type semiconductor material and a p-type semiconductor material and having a light-incident side and an opposite side;
a trench, opening toward the light-incident side of the junction, for trapping reflected light; and
a reflective layer, disposed on the side of the junction, opposite the light-incident side of the junction, that includes phosphor particles that convert photons which pass through the semiconductor material, without being absorbed, from a lower energy to a higher energy suitable for subsequent absorption by the semiconductor material;
wherein the trench includes a top, a lowermost surface, and at least one plateau elevated above the lowermost surface but disposed below the top of the trench; and
wherein an upper wall of the trench is inclined or declined relative to other surfaces of the trench.

20. The photovoltaic cell of claim 19, wherein the trench further includes an additional plateau disposed between the at least one plateau and the top of the trench.

21. The photovoltaic cell of claim 19, wherein the trench further includes an additional plateau disposed between the lowermost surface and the at least one plateau.

22. The photovoltaic cell of claim 19, wherein the phosphor particles are nano-particles.

23. The photovoltaic cell of claim 19, wherein the phosphor particles are micro-particles.

24. The photovoltaic cell of claim 19, wherein the composition of the reflective layer is selected to optimize subsequent absorption of the higher-energy photons, converted thereby, by the semiconductor material.

25. The photovoltaic cell of claim 19, further comprising a hollow, opening toward the opposite side of the junction, for minimizing carrier travel path to one or more contacts, for minimizing attenuation of long wavelength light used for up-conversion, or both.

26. The photovoltaic cell of claim 25, further comprising an electrical contact disposed in the hollow.

27. The photovoltaic cell of claim 25, wherein the reflective layer is arranged at least partially in the hollow.

28. A photovoltaic cell comprising:
   a junction formed from an n-type semiconductor material and a p-type semiconductor material and having a light-incident side and an opposite side;
   a trench, opening toward the light-incident side of the junction, for trapping reflected light; and
   a reflective layer, disposed on the side of the junction, opposite the light-incident side of the junction, that includes phosphor particles that convert photons which pass through the semiconductor material, without being absorbed, from a lower energy to a higher energy suitable for subsequent absorption by the semiconductor material;
   wherein the trench includes a top, a lowermost surface, and at least one plateau elevated above the lowermost surface but disposed below the top of the trench; and
   wherein a lower wall of the trench is inclined or declined relative to other surfaces of the trench.

29. The photovoltaic cell of claim 28, wherein the trench further includes an additional plateau disposed between the at least one plateau and the top of the trench.

30. The photovoltaic cell of claim 28, wherein the trench further includes an additional plateau disposed between the lowermost surface and the at least one plateau.

31. The photovoltaic cell of claim 28, wherein the phosphor particles are nano-particles.

32. The photovoltaic cell of claim 28, wherein the phosphor particles are micro-particles.

33. The photovoltaic cell of claim 28, wherein the composition of the reflective layer is selected to optimize subsequent absorption of the higher-energy photons, converted thereby, by the semiconductor material.

34. The photovoltaic cell of claim 28, further comprising a hollow, opening toward the opposite side of the junction, for minimizing carrier travel path to one or more contacts, for minimizing attenuation of long wavelength light used for up-conversion, or both.

35. The photovoltaic cell of claim 34, further comprising an electrical contact disposed in the hollow.

36. The photovoltaic cell of claim 34, wherein the reflective layer is arranged at least partially in the hollow.

37. A photovoltaic cell comprising:
   a junction formed from an n-type semiconductor material and a p-type semiconductor material and having a light-incident side and an opposite side;
   a trench, opening toward the light-incident side of the junction, for trapping reflected light; and
   a reflective layer, disposed on the side of the junction, opposite the light-incident side of the junction, that includes phosphor particles that convert photons which pass through the semiconductor material, without being absorbed, from a lower energy to a higher energy suitable for subsequent absorption by the semiconductor material;
   wherein at least a portion of the cross-section or profile of the trench is hexagonal in shape; and
   wherein the hexagonally-shaped portion of the trench profile opens to the light-incident side of the junction via a passage that is narrower than the width of the hexagonally-shaped portion.

38. The photovoltaic cell of claim 37, wherein the phosphor particles are nano-particles.

39. The photovoltaic cell of claim 37, wherein the phosphor particles are micro-particles.

40. The photovoltaic cell of claim 37, wherein the composition of the reflective layer is selected to optimize subsequent absorption of the higher-energy photons, converted thereby, by the semiconductor material.

41. The photovoltaic cell of claim 37, further comprising a hollow, opening toward the opposite side of the junction, for minimizing carrier travel path to one or more contacts, for minimizing attenuation of long wavelength light used for up-conversion, or both.

42. The photovoltaic cell of claim 41, further comprising an electrical contact disposed in the hollow.

43. The photovoltaic cell of claim 41, wherein the reflective layer is arranged at least partially in the hollow.

44. A photovoltaic cell comprising:
   a junction formed from an n-type semiconductor material and a p-type semiconductor material and having a light-incident side and an opposite side; and
   a trench, opening toward the light-incident side of the junction, for trapping reflected light, wherein at least a portion of the cross-section or profile of the trench is hexagonal in shape;
   wherein the hexagonally-shaped portion of the trench profile opens to the light-incident side of the junction via a passage that is narrower than the width of the hexagonally-shaped portion.

* * * * *